United States Patent [19]
Dungan et al.

[11] Patent Number: 5,311,391
[45] Date of Patent: May 10, 1994

[54] ELECTROSTATIC DISCHARGE PROTECTION CIRCUIT WITH DYNAMIC TRIGGERING

[75] Inventors: Thomas Dungan, Half Moon Bay; Eugene Coussens, Los Altos, both of Calif.

[73] Assignee: Hewlett-Packard Company, Palo Alto, Calif.

[21] Appl. No.: 57,277

[22] Filed: May 4, 1993

[51] Int. Cl.⁵ .............................................. H02H 9/00
[52] U.S. Cl. ........................................ 361/56; 361/58; 361/91
[58] Field of Search ............... 361/54, 56, 58, 91, 361/111, 212, 220; 257/355, 357, 358; 307/448, 450, 550, 551

[56] References Cited

U.S. PATENT DOCUMENTS

| | | | |
|---|---|---|---|
| 4,385,337 | 5/1983 | Asano et al. | 361/91 |
| 4,763,184 | 8/1988 | Krieger et al. | 357/23.13 |
| 4,868,705 | 9/1989 | Shiochi et al. | 361/91 |
| 4,870,530 | 9/1989 | Hurst et al. | 361/91 |
| 4,876,584 | 10/1989 | Taylor | 357/23.13 |
| 4,930,036 | 5/1990 | Sitch | 361/56 |
| 4,996,626 | 2/1991 | Say | 361/91 |
| 5,012,317 | 4/1991 | Rounte | 357/38 |
| 5,028,819 | 7/1991 | Wei et al. | 307/451 |
| 5,059,831 | 10/1991 | Itoh | 307/482.1 |
| 5,060,037 | 10/1991 | Rountree | 357/23.13 |
| 5,086,365 | 2/1992 | Lien | 361/58 |
| 5,237,395 | 8/1993 | Lee | 361/56 |

*Primary Examiner*—A. D. Pellinen
*Assistant Examiner*—Sally C. Medley

[57] ABSTRACT

Electrostatic discharge (ESD) protection circuitry having a string of diode-connected field-effect transistors (FETs) connected between a bus and ground plane for triggering a shunt element, such as a large n-channel FET, connected between the same or a different bus and the ground plane. The bus or buses are diode-connected through the base-emitter junction of pnp transistors to signal pads, as well as to a positive voltage power supply. The string of FETs turns on when the pad-to-ground voltage, and thus the bus-to-ground voltage, exceeds a threshold characteristic of an ESD event. The string acts as a voltage divider to bring a node between two of the FETs up to a voltage that will activate an n-channel trigger FET, which is part of a resistive-load inverter. This drives another inverter that in turn drives the shunt FET. When the voltage is pulled back down below the threshold voltage, the shunt FET continues to shunt current to the ground plane for the duration of the ESD event.

9 Claims, 4 Drawing Sheets

ELECTROSTATIC DISCHARGE PROTECTION CIRCUIT WITH DYNAMIC TRIGGERING

TECHNICAL FIELD

The present invention relates to an electrical safety system using an on-chip protection circuit to prevent damage to the chip. The invention relates in particular to triggering means responsive to an electrostatic discharge (ESD) condition for activating the protection circuitry during an ESD event and for maintaining the protection circuitry in an off state during normal conditions.

BACKGROUND ART

During a two terminal, electrostatic discharge (ESD) event, a large current pulse is injected into one electrical connection or signal pad of an integrated circuit and extracted from another pad, with all other pads floating. Typical current pulses from such events have peak injected currents that exceed one ampere. For an integrated circuit to survive such an event without damage, a robust, low impedance shunt path for the current must be available from any pad to any other pad. In order to avoid interfering with the integrated circuit's normal operation, ESD protection circuitry generally have both active (on) and inactive (off) states. The protection circuit should stay off under normal operating conditions and turn on quickly during an ESD event. It should effectively steer current into the intended shunt path when it is active, but should not interfere with normal operation while in its off state. In particular, the protection circuit coupled to a signal pad must not add excessive resistive or capacitive load to the pad, or add excessively to the noise level of signals applied to the signal pad, or have substantial off-state leakage.

Some functional applications of an integrated circuit require direct connections of input or output (I/0) terminal pads to one or more external buses. These buses may carry active signals even when power is not applied to the integrated circuit. ESD protection circuitry must not interfere with the operation of those buses under those conditions. The directly connected I/0 pads must not draw excessive current when a bus signal is pulled high and power to the integrated circuit is off. Because the buses can carry active signals even when power to an integrated circuit with one or more I/0 pads directly connected to the bus is off, the protection circuitry must maintain a high trigger voltage in power-off conditions. Consequently, the ESD protection circuits must have a trigger voltage that is independent of the supply voltage. Conventional shunt devices, such as silicon controlled rectifiers (SCRs) and field FETs, are triggered by avalanche breakdown or punchthrough above some fixed voltage threshold. These devices require series resistance between the shunt device and the nFET driver of the I/0 pad for reliable protection in many integrated circuit processes. Alternatively, capacitive coupling could be used to lower the trigger voltage of such shunt devices under transient conditions, but, with capacitive coupling, the above-noted requirement for low power-off leakage with signals active would be very difficult to meet.

An object of the invention is to provide an ESD protection circuit for I/0 terminal pads of an integrated circuit with supply voltage independent triggering, meeting low leakage, no series resistance requirements, which is especially adapted for situations where signals-active/power-off ESD protection is needed.

Another object of the invention is to provide such an ESD protection circuit which is also adaptable for use on signals that do not have the signals-active/power-off requirement, so that a diode connection from the signal to the positive power supply bus is tolerable.

DISCLOSURE OF THE INVENTION

The above objects are met by an ESD protection circuit for an integrated circuit in which a string of diode-connected field-effect transistors (FETs) connected between a bus and ground dynamically triggers a shunt element connected to the same or a different bus and ground. Each bus is diode-connected to a power supply voltage pad with the anode on the power supply and the cathode on the bus and to at least one signal pad of the integrated circuit. The string of diode-connected FETs turns on when the signal pad-to-ground, and thus, the bus-to-ground voltage exceeds a threshold characteristic of an ESD event, and the diode strings then act as a voltage divider to bring the voltage on a node between two of the diode-connected FETs in the string up to a voltage sufficient to turn on an n-channel FET, called the trigger FET, which is part of a resistive-load inverter. The output of the resistive-load inverter, a node between a load resistor and the trigger FET, is connected to the input of another inverter, the output of which provides the trigger voltage to the shunt element. The inverters are themselves powered by the ESD bus. Activating the shunt element, preferably a large n-channel FET capable of sinking a large amount of current, typically at least one ampere, will pull the bus-to-ground voltage, and hence the signal pad-to-ground voltage, back below the threshold voltage. As the voltage drops and the string of diode-connected FETs turns off, charge is captured on the gate of the trigger FET and only gradually leaks out through the trigger FET. Accordingly, the shunt element remains on, allowing it to continue to sink the current from the electrostatic discharge.

One embodiment incorporates a boost capacitor between the bus and a second node of the diode-connected FET string above the first node with at least one intervening FET in order to speed up the turning on of the shunt element during an ESD event. A feedback FET may be provided for the inverter driving the shunt, in order to form a regenerative circuit that keeps the shunt element on for the duration of the ESD event without the need for charge trapping at the gate of the trigger FET. Other embodiments use separate buses for the trigger elements and the shunt element, or use the line connected to the power supply terminal as the bus. The latter embodiment cannot be used in the signals-active/power-off case.

BEST MODE FOR CARRYING OUT THE INVENTION

Figure 1:
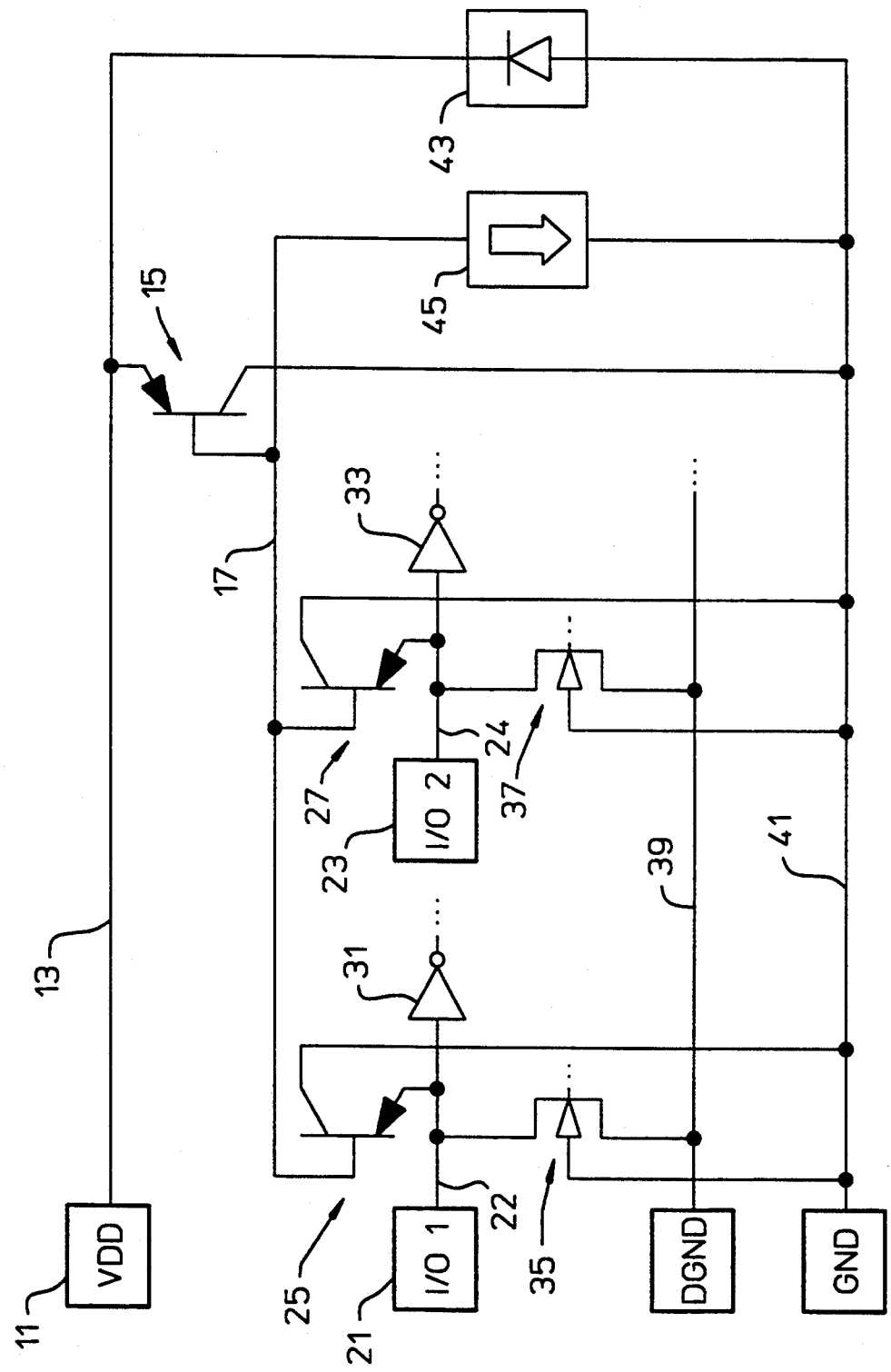
FIG. 1 is a schematic circuit diagram of an integrated circuit showing pad connections to ESD protection circuitry of the present invention.

With reference to FIG. 1, an integrated circuit has a power supply pad 11 connected to a power supply voltage line 13, which in turn is diode-connected through the base-emitter junction of a pnp transistor 15 to an electrostatic discharge (ESD) protection bus 17. The emitter of the transistor 15 is connected to the line 13, while the base of the transistor 15 is connected to the bus 17. The collector of the transistor 15 is connected to a ground plane 41. By ground plane 41 we mean not only the substrate ground but also any node in the circuit which has a diode path from that node to all of the signal pads. It is the ESD current return path. Typically, the ground plane 41 would be substrate ground in a p-type substrate process. The integrated circuit also has input/output signal pads 21, 23, etc. connected through respective signal lines 22, 24, etc. to input receivers 31, 33, etc. N-channel, pull-down field-effect transistors 35, 37, etc. couple the signal lines 22, 24, etc. to a "dirty" ground line 39 isolated from the "clean" ground 41 provided for the core circuitry 43 of the integrated circuit. Note that field-effect transistors 35, 37, etc. are part of the output drive circuitry, not the ESD protection circuitry.

The I/0 signal pads 21, 23, etc. are diode-connected to the ESD protection bus 17 through the base-emitter junctions of respective pnp transistors 25, 27, etc. The emitters of transistors 25, 27, etc. are connected to respective signal lines 22, 24, etc., while the bases of the transistors 25, 27, etc. are connected to the bus 17. The collectors of the transistors 25, 27, etc. are connected to the ground plane 41. Note that in this embodiment, the signal pads 21, 23, etc. do not have diode connections to the power supply terminal 11 to prevent loading of any external bus connected to the signal pads 21, 23, etc. when the power is off. Also note that while pnp transistors 15, 25, 27, etc. are the preferred diode connection from the pads 11, 21, 23, etc. to the ESD protection bus 17, the diode connection could be provided by any large current (bipolar) diode with the anode of each diode connected to the respective signal or power supply pad and the cathode of each diode connected to the bus 17. The collector current in the pnp transistors 15, 25, 27, etc. provides an extra shunt path to the ground plane 41, but the absence of such an extra path in simple diodes is not a significant detriment to the protection circuit's operation. Other than these collector-to-ground paths, the pads do not require any local shunt devices or series resistors. Primary shunting of current during an electrostatic discharge (ESD) event is provided by a remote shunt circuit 45 connected between the ESD protection bus 17 and the ground plane 41.

Figure 2:
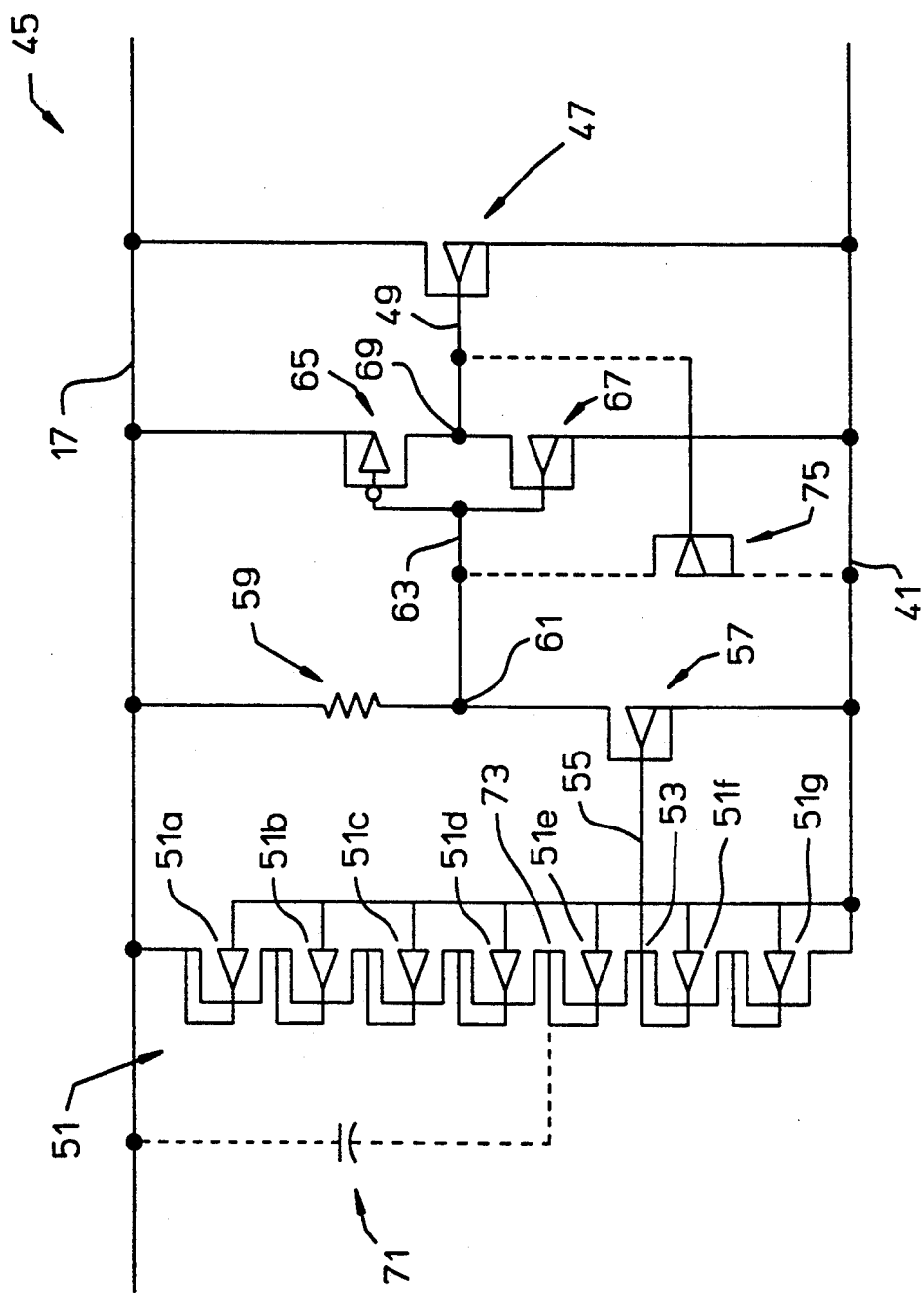
FIG. 2 is a schematic circuit diagram of ESD protection circuitry of the present invention for the integrated circuit of FIG. 1.

The ESD protection circuitry 45 is shown in detail in FIG. 2. A large n-channel MOS shunt FET 47 has a drain connected to the ESD protection bus 17 and a source connected to the ground plane 41. The gate 49 of the shunt FET 47 is provided with a trigger voltage by the protection circuitry that drives the shunt FET 47 so that it will conduct a substantial current to ground during an ESD event. The shunt FET 47 should typically be designed to conduct at least 1 A when active. The shunt FET 47, unlike many previous shunt elements, operates in the normal conduction mode with no junction breakdown. However, the particular kind of shunt element used in the protection circuit is less important to the invention than the trigger mechanism that drives the shunt element 47.

A string 51 of diode-connected nFETs 51a–51g is connected between the bus 17 and ground 41. Each nFET 51a–51g in the string 51 has its gate and drain connected together to the source of the next higher nFET. A node 53 between two of the nFETs 51e and 51f connects to the gate 55 of an n-channel "trigger" FET 57. This trigger FET 57 is part of a resistive-load inverter, which also includes a load resistor 59. The resistor 59 is connected between the bus 17 and an output node 61 of the inverter. A resistance of about 10kΩ is typical. The trigger FET is connected between the output node 61 and ground 41. A second inverter has an input 63 connected to the output node 61 of the resistive-load inverter and an output 69 providing the trigger voltage to the gate 49 of the nFET shunt element 47. The inverter is preferably a CMOS inverter with p-channel and n-channel MOS transistors 65 and 67 connected in series between the bus 17 and ground 41. Both inverters must be powered by the ESD protection bus 17 for signals-active/power-off applications.

Triggering of the shunt element 47 independent of the supply voltage $V_{DD}$ on the power supply line 13 is provided by the string 51 of diode-connected nFETs 51a–51g, which act as a voltage divider with a minimum voltage to begin conduction. The string 51 will not conduct significantly until the voltage between the ESD protection bus 17 and the ground plane 41 exceeds the sum of the individual threshold voltages of the FETs 51a–51g in the string. Since the string 51 acts as a resistive voltage divider, the bus-to-ground voltage or "threshold" voltage needed to activate the trigger FET 57 will depend on the number of FETs on the ground side of the node 53 compared to the total number of FETs in the string. A typical threshold voltage is about 7 V.

During an ESD event, a rapidly increasing amount of current is injected into a signal pad. The pad has no low impedance path to ground until the ESD protection circuitry turns on. Accordingly, the injected current rapidly charges up the pad capacitance and produces a pad voltage that increases above that on the ESD protection bus 17. Current flows through the emitter-base junction of the pnp transistor 25, 27, etc. that corresponds to the charging I/0 pad 21, 23, etc. into the bus 17, raising the bus-to-ground voltage above the threshold voltage for turning on the string 51 of diode-connected FETs 51a–51g. When the increasing voltage at node 53 applied to the gate 55 of trigger FET 57 becomes sufficiently large, the trigger FET 57 turns on, pulling down the voltage on the inverter node 61 until the shunt FET 47 turns on. Because the inverters have a finite turn-on time, the pad voltage will overshoot the threshold voltage by some amount before the shunt FET 47 reaches full conduction. Then the voltage will be pulled back down as the injected current is shunted from the ESD protection bus 17 through the shunt FET 47 to the ground plane 41. When the bus-to-ground voltage is pulled down, the string 51 of diode-connected FETs 51a–51g shuts off, trapping charge at the node 53. Trigger FET 57 stays on, so the shunt FET 47 continues to draw current from the bus 17 to the ground 41 until the trapped charge has leaked sufficiently to shut off the trigger FET 57. The signal pad voltage will overshoot before being pulled back below the ESD circuits' threshold. The voltage on the ESD protection bus will differ from the signal pad voltage by the voltage drop across the pnp transistor's base-emitter junction.

The embodiment shown in FIGS. 1 and 2 shares an ESD protection bus 17 and shunt FET 47 among several I/O pads 21, 23, etc. Alternatively, each pad 21, 23, etc. could have its own shunt element.

Another variation is the optional provision of a boost capacitor 71 to the ESD protection circuitry, as seen in FIG. 2, in order to speed up the turn on time and reduce the voltage overshoot on the affected pad. The boost capacitor 71 is connected between the ESD protection bus 17 and a node 73 between two of the diode-connected FETs 51d and 51e in the string 51. This second node 73 must be between the first node 53 that is connected to the gate 55 of the trigger FET 57 and the bus 17 with at least one diode-connected FET 51e between the two nodes 53 and 73. A typical 10 fF boost capacitor will reduce the voltage overshoot on the signal pad, but will also increase the current drawn by the protection circuitry on low-to-high signal transistors on the pad with power off.

Another variation is the optional provision of a feedback FET 75 connected between the inverter output 69 and the inverter input 63. The n-channel device 75 has a drain connected to the inverter input 63, a source connected to the ground plane 41 and a gate connected to the inverter output 69. This makes a regenerative circuit for the inverter, forming essentially a latch, that, as soon as the voltage on the inverter output 69 applied to the gate 49 of the shunt FET 47 is high enough to turn on the shunt FET 47, helps to pull down the inverter input 63 so that the shunt FET 47 can turn on more rapidly. The regenerative circuitry provided by the feedback FET 75 adds the dynamic operation of the ESD protection circuit without the necessity of charge capturing on the gate 55 of the trigger FET 57. The string of diode connected FETs 51a-51g is still used as the triggering mechanism in the ESD protection circuit, but is no longer needed to hold the shunt element 47 on. Accordingly, as a further option one could now introduce a resistive path from trigger FET's gate 55 to the ground plane 41 so that the circuit does not have a floating node 53. For example, the circuit could have a single diode FET 51f or 51g between node 53 and the ground plane 41, or the gates of FETs 51f and 51g could both be connected to node 53, or a resistor could replace both FETs 51f and 51g.

Figure 3:
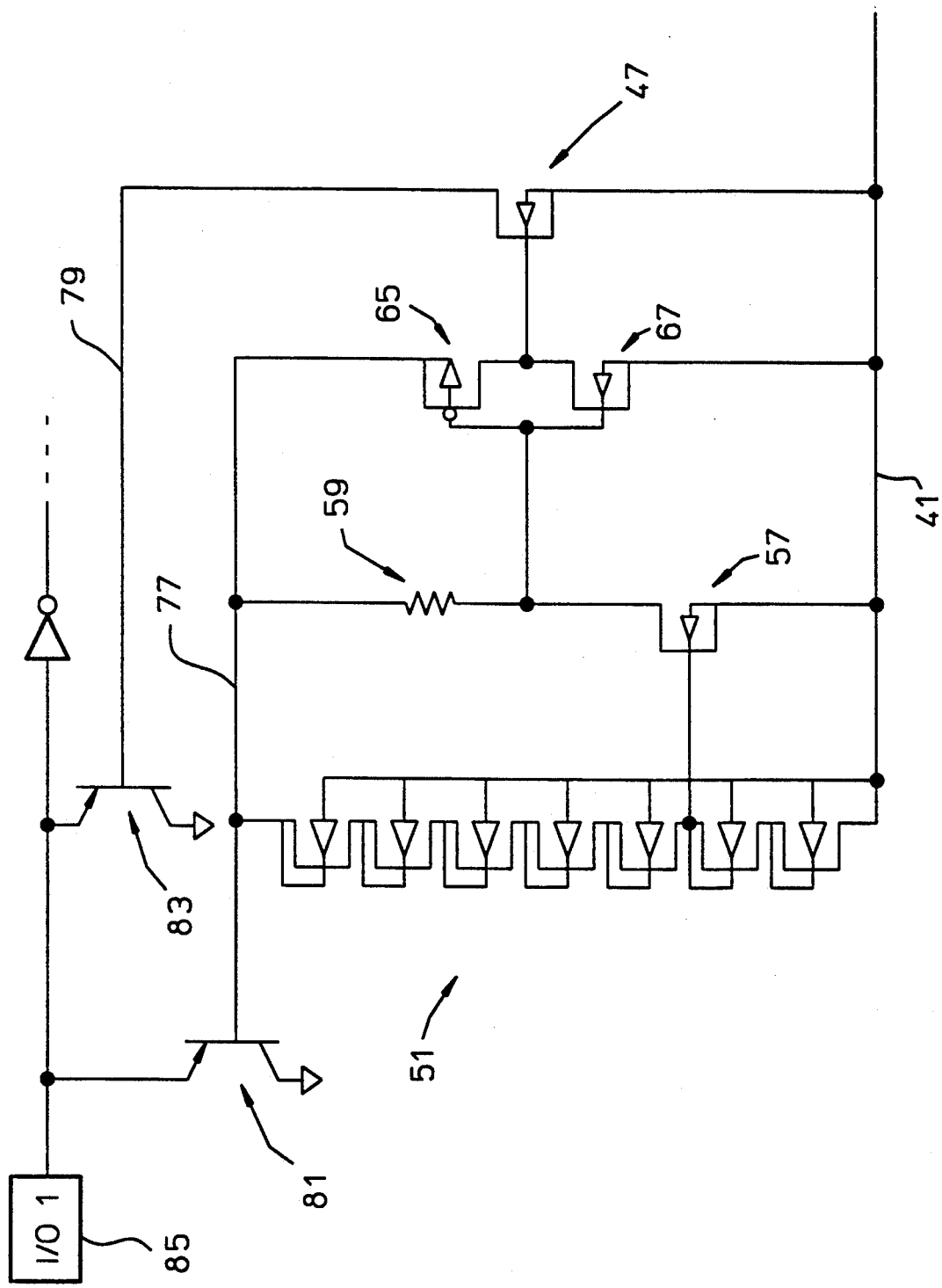
FIG. 3 is a schematic circuit diagram of an alternate ESD protection circuit embodiment of the present invention.

With reference to FIG. 3, another circuit variation splits the ESD protection bus 17 of FIG. 2 into separate trigger and shunt buses 77 and 79, respectively, each with separate diode connections 81 and 83 to the signal pads 25, etc. Each bus 77 and 79 is also diode connected to a power supply in a manner similar to the connection via pnp transistor 15 of bus 17 to power supply line 13 in FIG. 1. The string of diode-connected FETs 51 are connected between the trigger bus 77 and ground 41, while the shunt FET 47 is connected between the shunt bus 79 and the ground plane 41. The inverter elements 57, 59, 65 and 67 can be connected to either bus 77 or 79. The division of the ESD bus 17 of FIG. 2 allows separate optimization of the diode connections 81 and 83 from the signal pad 85 to the two buses 77 and 79. For example, the shunt element 47 must be coupled to the I/O pad 85 through a large, low resistance pnp 83 with the current gain maintained at as high an emitter current as possible. In the single bus case (FIG. 2), this requirement dominates the selection of the diode connections 25, 27, etc. However, to minimize leakage, the trigger circuitry would benefit from a low gain connection, which could come from a much smaller pnp transistor 81 or from a diode-connected FET.

Figure 4:
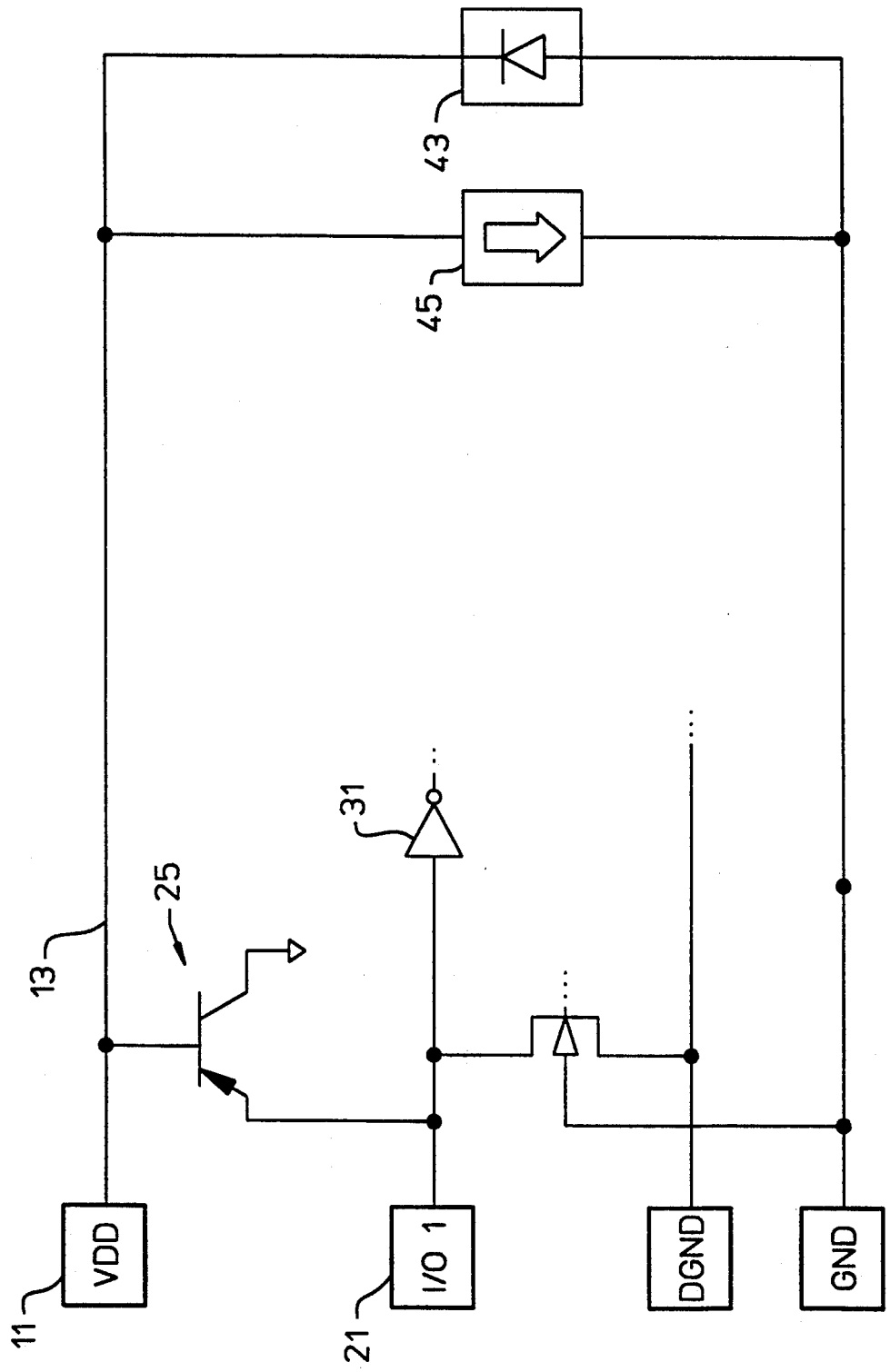
FIG. 4 is a schematic circuit diagram of alternative pad connections to ESD protection circuitry of the present invention.

With reference to FIG. 4, in another embodiment, the I/O signal pads 21 of an integrated circuit that are not connected to external buses that are active when the power to the integrated circuit is off can be diode-connected to the power supply line 13 via the base-emitter junction of a pnp transistor 25. This is equivalent to connecting the power supply terminal 11 directly to the ESD protection bus 17 of FIG. 2 instead of indirectly through a pnp transistor 15. Triggering of the protection circuitry 45 is then directly related to the voltage $V_{DD}$ supplied by the power supply terminal 11. The diode-connected FET string 51 of FIG. 2 continues to provide dynamic operation of the shunt element connected between the power supply line 13 and ground, by capturing charge or by the latching operation of feedback FET 75 once the power supply line has been pulled back down during an ESD event. Shunting of current therefore continues during the entire ESD event until the trapped charge leaks out of the diode-connected string of FETs 51. This embodiment is useful as a core conductance supplement for standard protection of not very robust core circuitry 43.

What is claimed is

1. An electrostatic discharge (ESD) protection circuit comprising
   a bus diode-connected to at least one signal pad of an integrated circuit with an anode of a diode connected to the signal pad and a cathode of the diode connected to said bus, said bus also coupled to a positive-voltage power supply,
   a shunt element capable, when active, of delivering current from said bus to a ground plane of said integrated circuit, said shunt element activated by a trigger voltage applied thereto,
   triggering means responsive to a pad-to-ground voltage between said signal pad and said ground plane for providing said trigger voltage whenever said pad-to-ground voltage exceeds a threshold characteristic of an ESD event, said triggering means including
   a string of diode-connected field effect transistors (FETs) coupled between said signal pad and said ground plane with a node between two of said diode-connected FETs,
   a resistive-load inverter with a load resistor and an n-channel trigger FET connected in series between said bus and said ground plane, a gate of said trigger FET connected to said node of said string of diode-connected FETs, an output node of said resistive-load inverter being between said load resistor and said trigger FET, and
   a CMOS inverter with an input connected to said output node of said resistive-load inverter and with an output connected to said shunt element.

2. The circuit of claim 1 wherein said signal pad is diode-connected to said bus through a base-emitter junction of a pnp transistor with an emitter of said transistor connected to said signal pad and a base of said transistor connected to said bus.

3. The circuit of claim 2 wherein said bus is connected directly to said power supply.

4. The circuit of claim 2 wherein said bus is diode-connected to said power supply with an anode of a diode connected to the power supply and a cathode of the diode connected to said bus.

5. The circuit of claim 4 wherein said bus is diode-connected to said power supply through a base-emitter junction of another pnp transistor with an emitter of said transistor connected to said power supply and a base of said transistor connected to said bus.

6. The circuit of claim 2 wherein said string of diode-connected FETs is connected to a second bus and to ground, said second bus also being diode-connected to said signal pad through a base-emitter junction of another pnp transistor with an emitter of said transistor connected to said signal pad and a base of said transistor connected to said second bus, said second bus also being diode-connected to a power supply with an anode of a diode connected to said power supply and a cathode of the diode connected to said second bus.

7. The circuit of claim 6 wherein said second bus is diode-connected to said power supply through a base-emitter junction of a third pnp transistor with an emitter of said transistor connected to said power supply and a base of said transistor connected to said second bus.

8. The circuit of claim 1 wherein said triggering means further includes a boost capacitor connected between said bus and a second node of said string.

9. The circuit of claim 1 further comprising a feedback FET with a gate connected to said output of said CMOS inverter, a drain connected to said input of said CMOS inverter, and a source connected to said ground plane.

* * * * *